US010256968B1

(12) United States Patent
Wu et al.

(10) Patent No.: US 10,256,968 B1
(45) Date of Patent: Apr. 9, 2019

(54) SYSTEMS AND METHODS FOR CLOCK AND DATA RECOVERY

(71) Applicant: Xilinx, Inc., San Jose, CA (US)

(72) Inventors: Zhaoyin D. Wu, San Jose, CA (US); Yu Xu, Palo Alto, CA (US); Winson Lin, Daly City, CA (US); Yohan Frans, Palo Alto, CA (US); Geoffrey Zhang, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/660,141

(22) Filed: Jul. 26, 2017

(51) Int. Cl.
*H04L 7/00* (2006.01)
*H03L 7/081* (2006.01)
*H04L 7/033* (2006.01)

(52) U.S. Cl.
CPC .......... *H04L 7/0025* (2013.01); *H03L 7/0814* (2013.01); *H04L 7/0004* (2013.01); *H04L 7/0337* (2013.01); *H04L 7/0334* (2013.01); *H04L 7/0338* (2013.01)

(58) Field of Classification Search
CPC .................................................... H04L 7/0025
USPC .......................................................... 375/355
See application file for complete search history.

(56) References Cited

U.S. PATENT DOCUMENTS

| | | | |
|---|---|---|---|
| 8,253,451 B1 | 8/2012 | Hsieh et al. | |
| 9,065,601 B1 | 6/2015 | Jenkins et al. | |
| 9,264,219 B1 * | 2/2016 | Kang | H03L 7/091 |
| 9,356,775 B1 | 5/2016 | Xu et al. | |
| 9,419,783 B1 * | 8/2016 | Wang | H04L 7/033 |
| 9,455,848 B1 | 9/2016 | Zhang et al. | |
| 2009/0016413 A1 * | 1/2009 | Shen | H04J 13/00 375/149 |

OTHER PUBLICATIONS

U.S. Appl. No. 15/660,397, filed Jul. 26, 2017, Wu, Zhaoyin D., et al., "Systems and Methods for Clock and Data Recovery", San Jose, CA USA.
U.S. Appl. No. 15/346,434, filed Nov. 8, 2016, Yu Xu, "Resolving Meta-Stability in a Clock and Data Recovery Circuit", San Jose, CA USA.

* cited by examiner

*Primary Examiner* — Lihong Yu
(74) *Attorney, Agent, or Firm* — David O'Brien; Hong Shi

(57) ABSTRACT

A clock and data recovery (CDR) circuit includes a phase detector, a digital loop filter, and a lock detector. The phase detector generates a phase detect result signal in response to phase detection of a plurality of samples. The plurality of samples are generated by sampling a received signal based on a sampling clock a sampling clock provided by a phase interpolator. The digital loop filter includes a phase path and a frequency path for providing a phase path correction signal and a frequency path correction signal based on the phase detect result signal respectively. A phase interpolator code generator generates a phase interpolator code for controlling the phase interpolator based on the phase path correction signal and frequency path correction signal. The lock detector generates a lock condition signal based on the frequency path correction signal, the lock condition signal indicating a lock condition of the CDR circuit.

20 Claims, 12 Drawing Sheets

SYSTEMS AND METHODS FOR CLOCK AND DATA RECOVERY

FIELD

Examples of the present disclosure generally relate to integrated circuits (ICs) and, in particular, to an embodiment related to systems and methods for clock and data recovery (CDR).

BACKGROUND

Data transmission is an important application of many integrated circuit devices. Data may be transmitted according to different transmission protocols, and may be transmitted as serial data or parallel data. A clock and data recovery (CDR) circuit is an important block in a receiver system for high-speed serial communications. The CDR circuit may generate a sampling clock with the correct sampling clock phase for data recovery. The quality of the high-speed serial communication link may be sensitive to the sampling clock phase, especially in the presence of jitter and noise. A CDR circuit may be used to control operation of a phase interpolator ("PI") for generating the sampling clock. A lock condition for the CDR circuit may be used to determine that the sampling clock from the PI is valid. However, lock conditions of the CDR are susceptible to differences between transmitter and receiver reference clock signals. If both ends of a serial link use the same reference clock signal, then the CDR circuit may be relatively simple. However, each end of a serial data transmission link may use a separate, uncorrelated reference clock. If the frequencies of the transmitter and receiver reference clocks are different, then the phase error may change continuously. As the difference in reference clock frequencies increases, the phase error may change more quickly, impacting the data recovery performance.

Accordingly, it would be desirable and useful to provide an improved CDR circuit.

SUMMARY

In some embodiments in accordance with the present disclosure, a clock and data recovery (CDR) circuit includes a phase detector, a digital loop filter, and a lock detector circuit. The phase detector is configured to generate a phase detect result signal in response to phase detection of a plurality of samples. The plurality of samples are generated by sampling a received signal based on a sampling clock provided by a phase interpolator. The digital loop filter includes a phase path configured to provide a phase path correction signal including a first estimate associated with a phase of the received signal based on the phase detect result signal; a frequency path configured to provide a frequency path correction signal including a second estimate associated with a frequency of the received signal based on the phase detect result signal; and a phase interpolator code generator configured to generate a phase interpolator code for controlling the phase interpolator based on the phase path correction signal and frequency path correction signal. A lock detector circuit is configured to generate a lock condition based on the frequency path correction signal, the lock condition signal indicating a lock condition of the sampling clock associated with the received signal.

In some embodiments, the lock detector circuit further comprises: a period extraction circuit configured to determine a frequency offset period based on the frequency path correction signal; and a first lock flag generator circuit configured to generate a first lock flag signal based on the frequency offset period and the frequency path correction signal. The lock condition signal is generated based on the first lock flag signal.

In some embodiments, the first lock flag generator circuit includes: a derivative generator circuit configured to generate a first derivative signal of the frequency path correction signal; an integrate and dump circuit configured to perform an integrate and dump process to the first derivative signal based on the frequency offset period to generate a derivative integration result signal; and a first comparator circuit configured to generate the first lock flag signal by comparing the derivative integration result signal with a first threshold.

In some embodiments, the lock detector circuit includes: a second lock flag generator circuit configured to generate a second lock flag signal based on the frequency offset period and the frequency path correction signal. The lock condition signal is generated based on the first and second lock flag signals.

In some embodiments, the second lock flag generator circuit includes: a feature extraction circuit configured to determine a first feature of the frequency path correction signal based on the frequency offset period; and a second comparator circuit configured to generate the second lock flag signal by comparing the first feature with a second threshold.

In some embodiments, the first lock flag generator circuit includes: a feature extraction circuit configured to determine a first feature of the frequency path correction signal based on the frequency offset period; and a comparator circuit configured to generate the first lock flag signal by comparing the first feature with a first threshold.

In some embodiments, the first feature is one of a minimum value of the frequency path correction signal over the frequency offset period and a maximum value of the frequency path correction signal over the frequency offset period.

In some embodiments, the period generator circuit further comprises: a moving average circuit configured to generate a moving average signal by applying a moving average filter to the frequency path correction signal; and a peak detection circuit configured to determine the frequency offset period based on adjacent peaks of the moving average signal.

In some embodiments, wherein the period generator circuit is configured to: receive a fixed frequency offset indicator indicating that the frequency offset is a constant; and provide the frequency offset period based on a predetermined period for the fixed frequency offset.

In some embodiments, the frequency offset period is associated with a modulation period of spread spectrum clocking (SSC) associated with the received signal.

In some embodiments in accordance with the present disclosure, a method includes generating a plurality of samples by sampling a received signal using a sampling clock provided by a phase interpolator; generating a phase detect result signal in response to phase detection of the plurality of samples; generating, by a phase path of a digital loop filter, a phase path correction signal including a first estimate associated with a phase of the received signal based on the phase detect result signal; generating, by a frequency path of the digital loop filter, a frequency path correction signal including a second estimate associated with a frequency of the received signal based on the phase detect result signal; generating a phase interpolator code for controlling the phase interpolator based on the phase path correction signal and frequency path correction signal; and generating a lock condition signal based on the frequency path correction signal, the lock condition signal indicating a lock condition between the sampling clock and the received signal.

In some embodiments, the method includes determining a frequency offset period based on the frequency path correction signal; generating a first lock flag signal based on the frequency offset period and the frequency path correction signal; and generating the lock condition signal based on the first lock flag signal.

In some embodiments, the method includes generating a first derivative signal of the frequency path correction signal; performing an integrate and dump process to the first derivative signal based on the frequency offset period to generate a derivative integration result signal; and generating the first lock flag signal by comparing the derivative integration result signal with a first threshold.

In some embodiments, the method includes generating a second lock flag signal based on the frequency offset period and the frequency path correction signal; and generating the lock condition signal based on the first and second lock flag signals.

In some embodiments, the method includes determining a first feature of the frequency path correction signal based on the frequency offset period; and generating the second lock flag signal by comparing the first feature with a second threshold.

In some embodiments, the method includes determining a first feature of the frequency path correction signal based on the frequency offset period; and generating the first lock flag signal by comparing the first feature with a first threshold.

In some embodiments, the method includes generating a moving average signal by applying a moving average filter to the frequency path correction signal; and determining the frequency offset period based on adjacent peaks of the moving average signal.

In some embodiments, the method includes receiving a fixed frequency offset indicator indicating that the frequency offset is a constant; and providing the frequency offset period based on a predetermined period for the fixed frequency offset.

Other aspects and features will be evident from reading the following detailed description and accompanying drawings.

DETAILED DESCRIPTION

Figure 1:
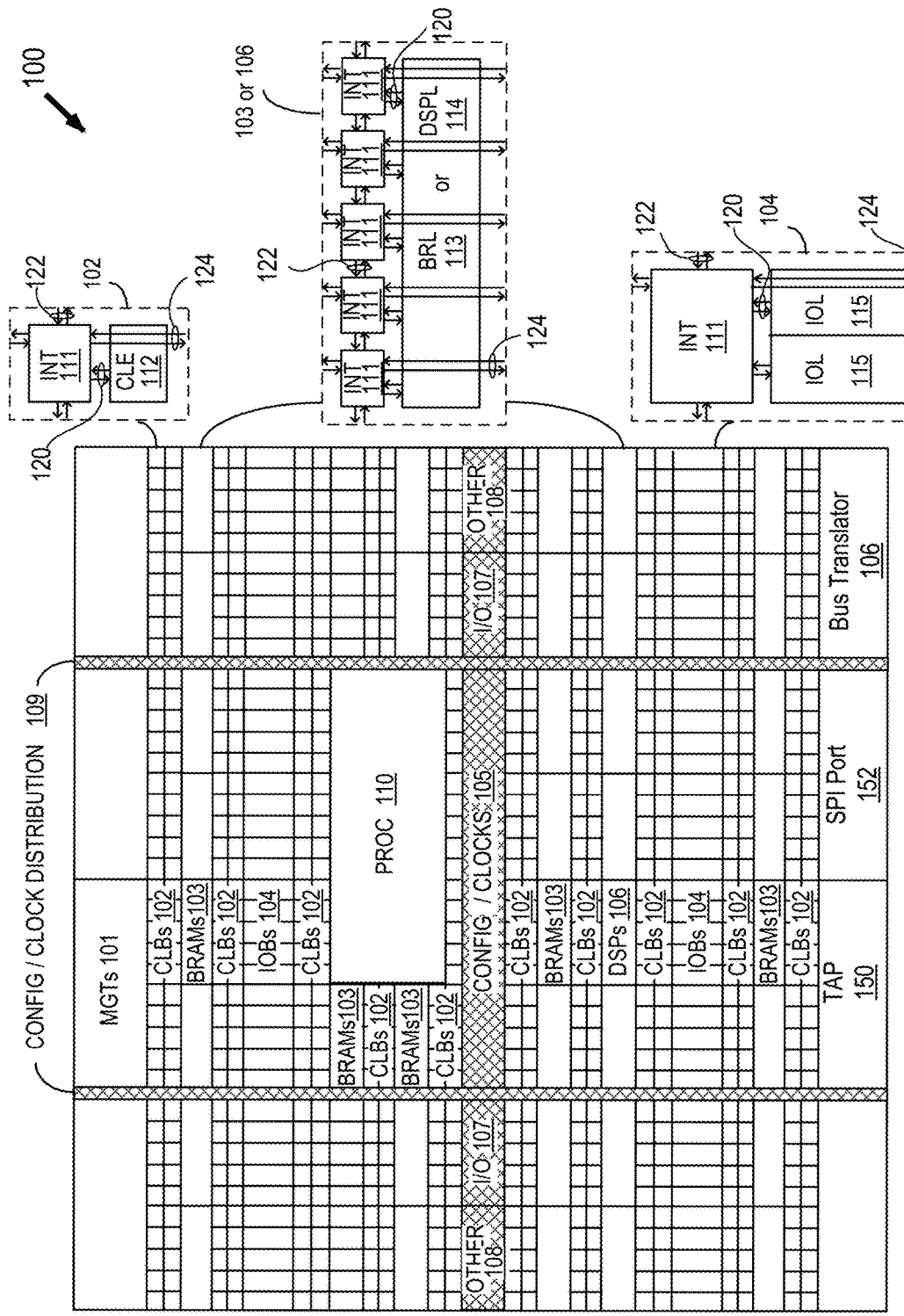
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding.

As discussed above, the lock condition of the CDR circuit may be susceptible to a frequency difference, also referred to as a frequency offset, between transmitter and receiver reference clock signals. In some embodiments, a lock detector circuit implemented using hardware separate from the CDR may be used to determine the lock condition of the CDR. In such embodiments, the lock detector circuit may include a bang-bang phase detector block that is a duplicate of the bang-bang phase detector block in the CDR, a leaky filter, and a comparison circuit. The lock detector circuit may receive a signal provided by a phase detector of the CDR, process the received signal using the bang-bang phase detector block and the leaky filter, and compare the resulting signal with a threshold to determine if the CDR is in a locked condition. However, such a lock detector circuit uses completely separate hardware from the CDR. Furthermore, it is hard to map the output of the leaky filter to the actual frequency offset. For integrated circuit (IC) solutions, it has been discovered that a lock detector circuit may determine a lock condition of the CDR based on an internal signal in the CDR. As such, a lock detector circuit may be implemented without using separate hardware for a duplicate bang-bang phase detector clock and the leaky filter.

With the above general understanding borne in mind, various embodiments for implementing CDR and its lock detection are generally described below. Various advantages may be present in various applications of the present disclosure. No particular advantage is required for all embodiments, and different embodiments may offer different advantages. One of the advantages of some embodiments is that the lock condition signal may be generated by processing a frequency path correction signal in a frequency path of a digital filter of the CDR circuit in real time. By using an internal signal of the CDR circuit, the lock detector circuit may be implemented without using separate hardware for a duplicate bang-bang phase detector clock and the leaky filter, which provides savings in hardware and area. Another advantage of some embodiments is that the frequency path correction signal may be directly mapped to the actual frequency offset (e.g., depending on a frequency offset resolution of the frequency path). This may provide more design flexibility for the lock detector circuit. For example, the frequency path correction signal may have waveform features that may be predicted based on the waveform features of the sources (e.g., spread spectral clocking (SSC), sinusoidal jitter (SJ)) of the frequency offset after the CDR starts to track the SSC or SJ in the received signal. As such, the lock detector circuit may determine the lock condition of the CDR circuit based whether one or more waveform features may be successfully extracted from the waveform of the frequency path correction signal. For further example, the lock detector circuit may determine the lock condition of the CDR based on a derivative of the frequency path correction signal.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device (CPLD). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An 10B 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as CPLDs or any type of programmable IC having a programmable interconnect structure for selectively coupling logic elements.

It is noted that the IC that may implement the CDR and its lock detection is not limited to the exemplary IC depicted in FIG. 1, and that IC having other configurations, or other types of IC, may also implement the CDR and its lock detect circuit.

Figure 2A:
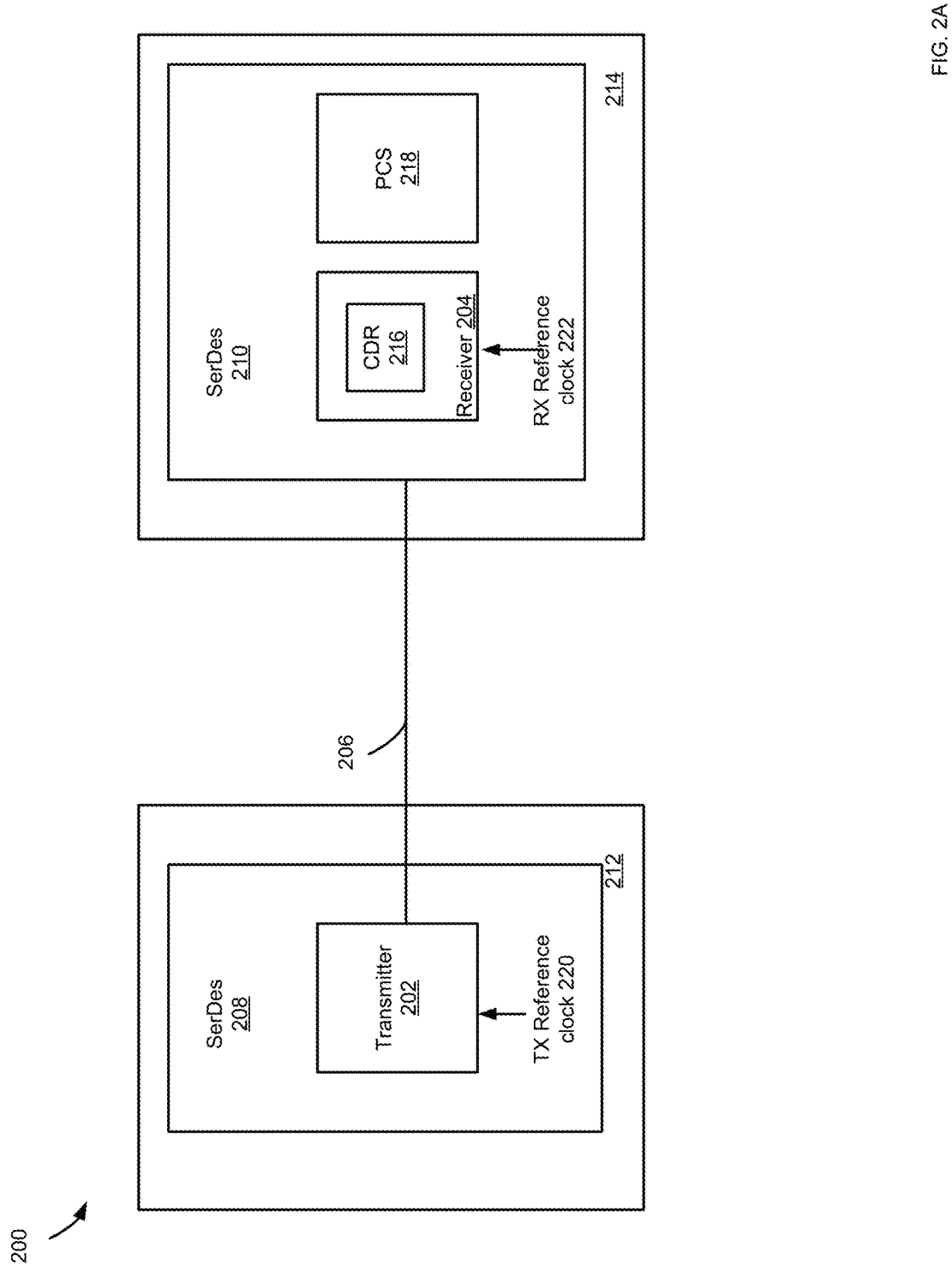
FIG. 2A is a block diagram illustrating an example of a communication system according to some embodiments of the present disclosure.

Referring to the example of FIG. 2A, illustrated is an example of a serial communication system 200. The serial communication system 200 includes a transmitter 202 coupled to a receiver 204 over transmission medium 206. The transmitter 202 can be part of a serializer-deserializer (SerDes) 208. The receiver 204 can be part of a SerDes 210. The transmission medium 206 may include an electrical path between the transmitter 202 and the receiver 204. The transmission medium 206 may include printed circuit board (PCB) traces, vias, cables, connectors, decoupling capacitors, and the like. In some examples, the SerDes 208 may be disposed in an integrated circuit (IC) 212, and the SerDes 210 can be disposed in an IC 214.

The transmitter 202 drives serial data onto the transmission medium 206 using a digital baseband modulation technique. In general, the serial data is divided into symbols. The transmitter 202 converts each symbol into an analog voltage mapped to the symbol. The transmitter 202 couples the analog voltage generated from each symbol to the transmission medium 206. In some examples, the transmitter 202 uses a binary non-return-to-zero (NRZ) modulation scheme. In binary NRZ, a symbol is one bit of the serial data and two analog voltages are used to represent each bit. In other examples, the transmitter 202 uses multi-level digital baseband modulation techniques, such as pulse amplitude modulation (PAM), where a symbol includes a plurality of bits of the serial data and more than two analog voltages are used to represent each bit.

The receiver 204 may include a clock and data recovery (CDR) circuit 216. The receiver 204 receives an analog signal from the transmission medium 206. The CDR circuit 216 operates to recover data and a clock from the analog signal. The receiver 204 provides the recovered data to physical coding sublayer (PCS) circuitry 218 in SerDes 210 for decoding and further processing.

As illustrated in FIG. 2A, the transmitter 202 may use a transmitter reference clock 220, and the receiver 204 may use a receiver reference clock 222. In some examples, there is a difference between the transmitter reference clock 220 and the receiver reference clock 222, which may be referred to as a frequency offset between the transmitter reference clock 220 and the receiver reference clock 222. A frequency offset may exist when the transmitter reference clock 220 and the receiver reference clock 222 use independent clock sources (e.g., clock sources that are nominally but not exactly identical in frequency). In some embodiments, the frequency offset may be fixed (e.g., equal to a constant). In some embodiments, the frequency offset may not be fixed, for example, is a periodic function of time.

Figure 2B:
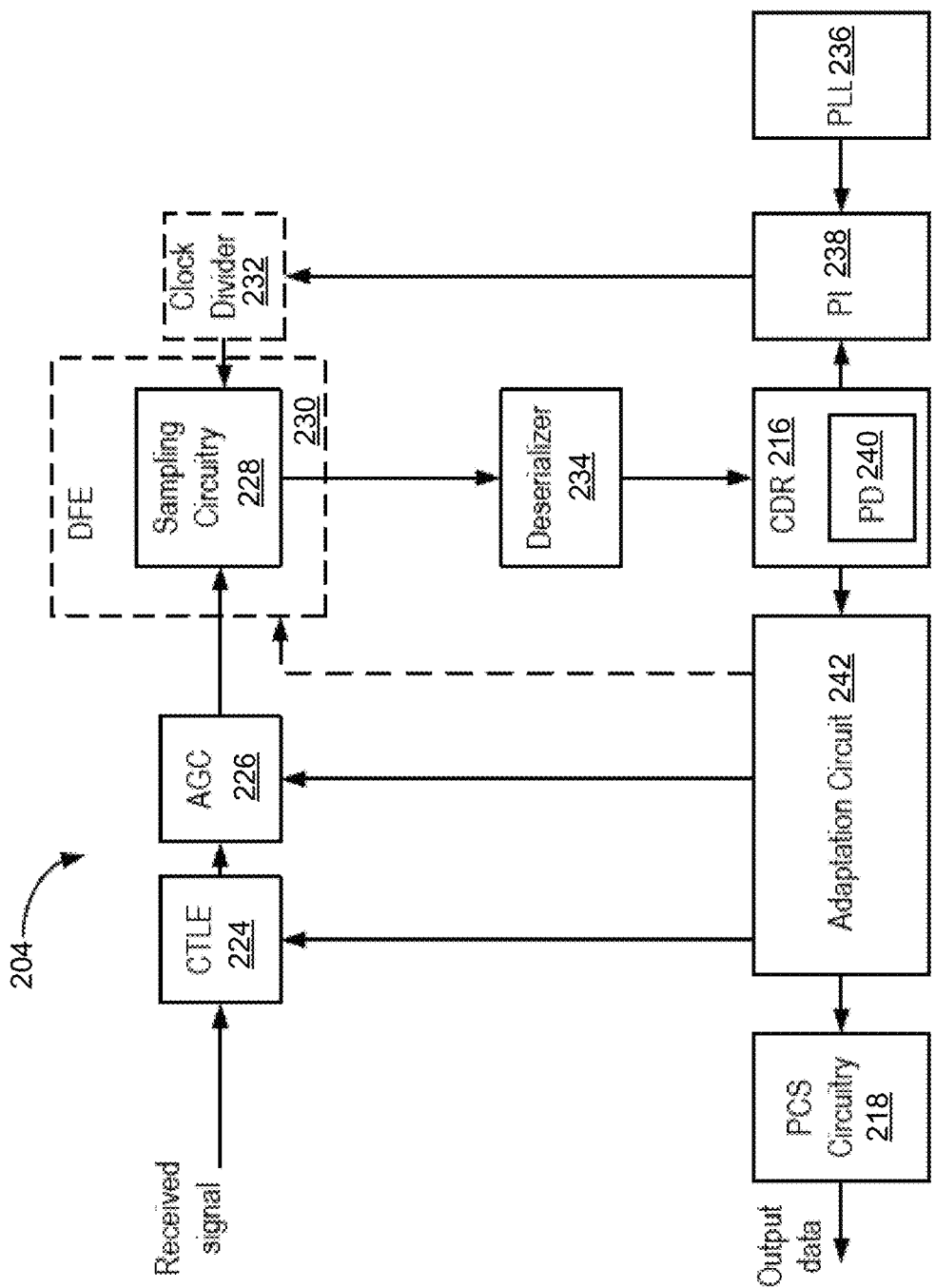
FIG. 2B is a block diagram illustrating an example of a receiver according to some embodiments of the present disclosure.

Referring to FIG. 2B, illustrated therein is a block diagram depicting the receiver 204 according to an example. The receiver 204 includes a continuous time linear equalizer (CTLE) 224, an automatic gain control (AGC) circuit 226, sampling circuitry 228, a deserializer 234, the CDR circuit 216, a phase interpolator (PI) 238, and an adaptation circuit 242. An output of the CTLE 224 is coupled to an input of the AGC circuit 226. An output of the AGC circuit 226 is coupled to inputs of the sampling circuitry 228. An output of the clock divider 232 is coupled to inputs of the sampling circuitry 228. An output the sampling circuitry 228 is coupled to an input of the deserializer 234. An output of the deserializer 234 is coupled to an input of the CDR circuit 216. Outputs of the CDR circuit 216 are coupled to an input of the adaptation circuit 242 and an input of the PI 238, respectively. Another input of the PI 238 is coupled to an output of a phase locked loop (PLL) circuit 236. In an example, an output of the PI 238 is coupled to an input of the sampling circuitry 228. In another example, the output of the PI 238 is coupled to an input of a clock divider 232, and an output of the clock divider 232 is coupled to an input of the sampling circuitry 228. Outputs of the adaptation circuit 242 are coupled to the CTLE 224, the AGC circuit 226, and the PCS circuitry 218, respectively. In an example, the sampling circuitry 228 can be part of a decision feedback equalizer (DFE) 230. In such case, another output of the adaptation circuit 242 is coupled to the DFE 230.

In operation, the CTLE 224 receives an analog signal from the transmission medium 206. The CTLE 224 operates as a high-pass filter to compensate for the low pass characteristics of the transmission medium 206. The peak of the frequency response of the CTLE 224 may be adjusted based on a CTLE adjust signal provided by the adaptation circuit 242. The AGC circuit 226 receives the equalized analog signal from the CTLE 224. The AGC circuit 226 adjusts the gain of the equalized signal based on a gain adjust signal provided by the adaptation circuit 242. In another example, the AGC circuit 226 can precede the CTLE circuit 224.

The sampling circuitry 228 generates data and crossing samples from the output of the AGC circuit 226 based on a sampling clock signal supplied by the PI 238. The sampling circuitry 228 may generate the data samples using a data sampling clock and the crossing samples using a crossing sampling clock, where the crossing sampling clock is shifted in phase from the data sampling clock by 90 degrees. The sampling circuitry 228 can generate both the data and crossing sampling clocks from the sampling clock signal supplied by the PI 238 (e.g., using a 90-degree phase shifter). Alternatively, the PI 238 can supply a sampling clock signal that includes both the data and crossing sampling clocks. In another example, the clock divider 232 can generate the data and crossing sampling clocks from the sampling clock signal supplied by the PI 238. The clock divider 232, if present, can also reduce the frequency of the sampling clock signal supplied by the PI 238. In an example, the sampling circuitry 228 is part of the DFE 230. The DFE 230 equalizes the output of the AGC circuit 226 to minimize inter-symbol interference (ISI).

Each data and crossing sample includes one or more bits depending on the type of modulation scheme employed (e.g., one-bit samples for binary NRZ and multi-bit samples for PAM). The deserializer 234 groups data samples and crossing samples to generate a deserialized signal. The deserializer 234 unifies the two separate parallel data and crossing sample streams into a deserialized signal to be processed by the CDR circuit 216.

The CDR circuit 216 generates a PI code signal from the deserialized signal generated by the deserializer 234. The PI 238 receives a reference clock signal from the PLL 236. The PI 238 shifts the phase of the reference clock signal based on the PI code signal output by the CDR circuit 216. The PI 238 outputs the phase-shifted reference clock signal as the sampling clock signal.

The CDR circuit 216 outputs a data signal to the adaptation circuit 242. The data signal includes the data samples output by the sampling circuitry 228. The adaptation circuit 242 generates control signals for the CTLE 224 and the AGC circuit 226 based on data signal using adaptation algorithms. If the DFE 230 is present, the adaptation circuit 242 generates a control signal for adjusting the taps of the DFE 230. The adaptation circuit 242 outputs the data signal to the PCS circuitry 218. The PCS circuitry 218 processes the data signal to recover the transmitted data.

In an example, the CDR circuit 216 includes a phase detector (PD) 240. The phase detector 240 determines whether to adjust the data sampling phase of a sampling clock and in which direction the data sampling phase should be adjusted. In an example, the phase detector 240 includes at least one bang-bang phase detector each operating on a pair of data bits and a crossing bit. The phase detector 240 generates a phase detect result signal. The phase detect result signal provides a net phase detect result from the bang-bang phase detectors. In an example, the net phase detect result may indicate whether the data sampling phase based on the sampling clock need to be adjusted, in which direction the data sampling phase need to be adjusted, and where to stop the adjustment. In an example where the data sampling phase is disposed in the center of the data eye, the CDR circuit is considered locked. In such an example, the sampling clock is also considered locked with respect to the received signal. Once a locked condition is achieved, the data sampling phase may then dither around the locked position.

Figure 2C:
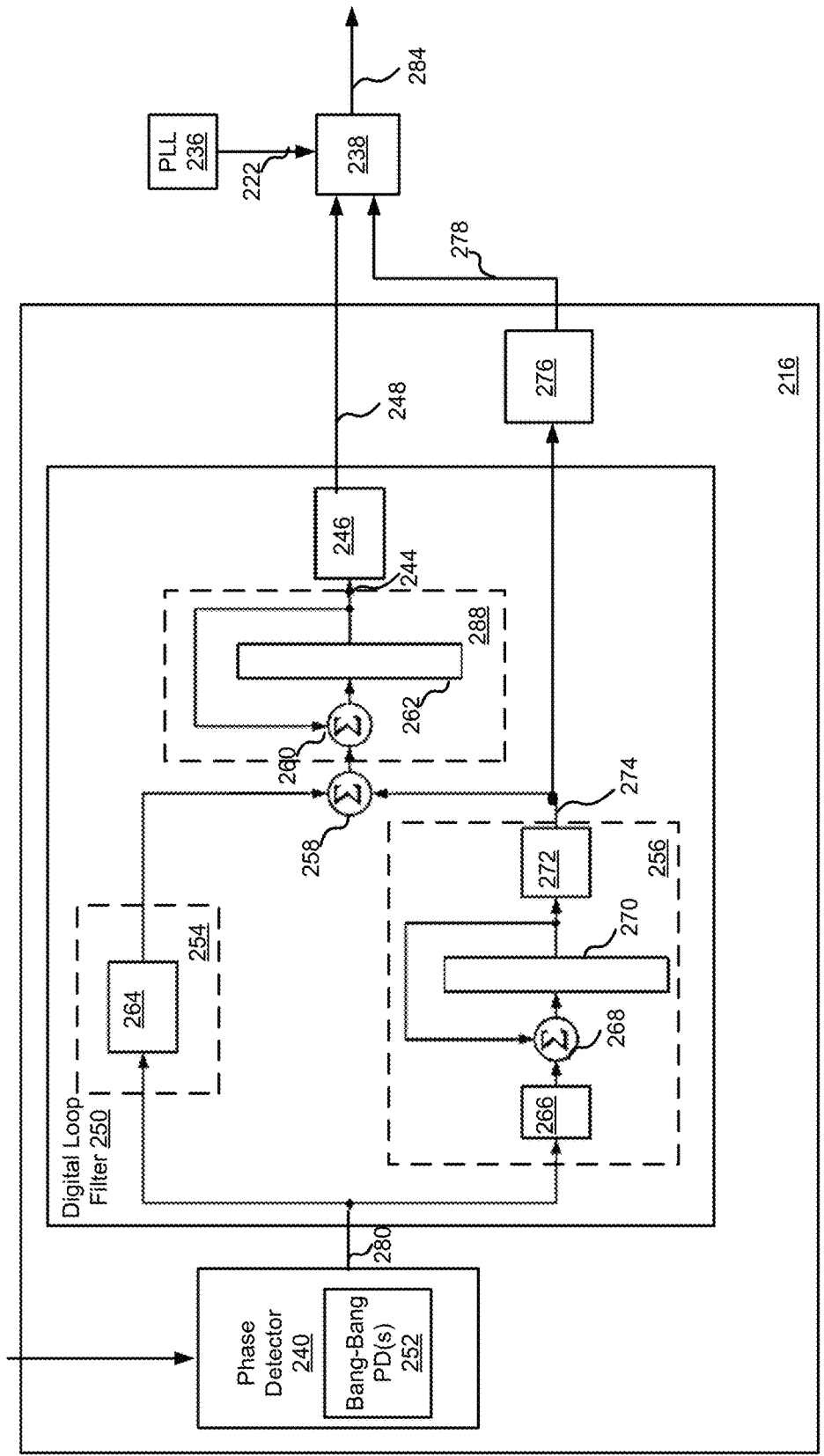
FIG. 2C is a block diagram illustrating an example of a CDR circuit according to some embodiments of the present disclosure.

Referring to FIG. 2C, illustrated is an exemplary CDR circuit 216. The CDR circuit 216 includes the phase detector 240, a digital loop filter 250, and a lock detector 276. An input of the phase detector 240 is coupled to an output of a deserializer 234 of the receiver 204, where the deserializer is coupled to an output of a sampling circuitry 228 of the receiver 204. An output of the phase detector 240 is coupled to an input of the digital loop filter 250.

In the example of FIG. 2C, the digital loop filter 250 includes a phase path 254, a frequency path 256, a summing circuit 258, a phase accumulator 288, and a phase divider 246 having a phase divider factor (a phase scaling factor). The phase accumulator 288 includes a summing circuit 260 and a phase register 262.

In some embodiments, the phase path 254 may provide a phase path correction signal. The phase path correction signal may include information associated with a phase estimate of the received data signal, which may be used to adjust the phase of the sampling clock. The phase path 254 may include a gain circuit 264 (e.g., a gain circuit including one or more multipliers). An input to the gain circuit 264 is coupled to an output of the phase detector 240, and an output of the gain circuit 264 is coupled to an input of the summing circuit 258.

The frequency path 256 may provide a frequency path correction signal. The frequency path correction signal may include information associated with a frequency estimate (e.g., a frequency offset estimate) associated with the received data signal. Such a frequency estimate may be used to adjust the phase of the sampling clock. In an example, the frequency path 256 is used to track the frequency offset between the transmitter reference signal and the receiver reference signal. The frequency path correction signal may be associated with a frequency offset estimate, which may be used to update a phase estimate of the phase position of the received signal. Such a phase estimate may then be used to adjust the sampling clock to compensate for shifts in the frequency spectrum (e.g., caused by jitters and/or spread spectrum clocking (SSC)). The frequency path 256 may include a gain circuit 266 (e.g., a gain circuit including one or more multipliers), a frequency accumulator, and a divider 272 having a frequency divider factor. The frequency accumulator includes a summing circuit 268 and a frequency register 270. An input to the gain circuit 266 is coupled to an output of the phase detector 240. An output of the gain circuit 266 is coupled to an input of the summing circuit 258. An output of the summing circuit 268 is coupled to an input of the frequency register 270, which stores a previous output of the summing circuit 268. An output of the frequency register 270 is coupled to another input of the summing circuit 268 and to an input of the divider 272. An output 274 of the frequency path 256 is coupled to another input of the summing circuit 258. The output 274 may also be referred to as a frequency path correction signal 274.

In some embodiments, the phase accumulator 288 is coupled to receive the phase path correction signal and the frequency path correction signal. The summing circuit 260 is coupled to an input of the phase register 262. An output of the phase register 262 is coupled to another input of the summing circuit 260 and to an input of a divider 246. The output 248 of the phase divider 246 is coupled to an input of a PI 238.

In operation, the phase detector 240 generates a phase detect result signal 280 based on the data and crossing samples in the deserialized data provided by the deserializer 234. The phase detector 240 can include a plurality of bang-bang phase detectors 252, each bang-bang phase detector 252 generating an individual phase detect result based on a pair of data samples and a crossing sample. The bang-bang phase detectors 252 can generate individual phase detect results using different sets of data/crossing samples. The phase detector 240 combines the individual phase detect results to generate the net phase detect result, and outputs a phase detect result signal 280 having the net phase detect result to the digital loop filter 250.

In some examples, the digital loop filter 250 performs a CDR algorithm to adjust the PI code signal 248 based on the phase detect result signal 280. In the phase path 254, the gain circuit 264 applies a phase gain (Gp) to the phase detect result signal 280. For example, the gain circuit 264 may implement a left-shift operation to apply the phase gain.

In some examples, in the frequency path 256, the gain circuit 266 applies a frequency gain (Gf) to the phase detect result signal 280. For example, the gain circuit 266 may implement a left-shift operation to apply the frequency gain. The output of the gain circuit 266 is integrated by the summing circuit 268 and the frequency register 270, and then is divided by a divider 272. The output 274 of the frequency path 256 may be added to the output of the phase path 254 by the summing circuit 258.

In some embodiments, the phase accumulator 288 may accumulate phase information included in the output of the summing circuit 258 to generate a phase accumulated total signal 244 using the summing circuit 260 and the phase register 262. The phase accumulated total signal 244 is sent to an input of a phase divider 246 having a phase divider factor. The phase divider 246 outputs a PI code signal 248.

In the example of FIG. 2C, the digital loop filter 250 provides the PI code signal 248 to the input of a PI 238. The PI 238 may receive a receiver reference clock signal 222 (e.g., provided by a PLL 236), and generate a sampling clock signal 284 based on the PI code signal 248 and the receiver reference clock signal 222. The sampling clock signal 284 may be provided to the sampling circuitry 228 of the receiver 204 for sampling a received signal. The sampling clock signal 284 may also be sent to the phase detector 240, where the phase detector 240 may generate the phase detect result signal 280 based on the deserialized signal from the deserializer and the sampling clock signal 284. The phase detector 240 may include at least one bang-bang phase detector 252.

In the example of FIG. 2C, the digital loop filter 250 also provides the frequency path correction signal 274 to a lock detector 276. The lock detector 276 may generate a lock condition signal 278 based on the frequency path correction signal 274. The lock condition signal 278 may indicate whether the CDR 216 is in a locked condition. In an example, the lock condition signal 278 is set to logic "high" to indicate a locked condition of the CDR 216 with respect to a phase of the input data from the deserializer 234, and is set to logic "low" to indicate an unlocked or out-of-lock condition of the CDR 216 with respect to a phase of the input data from the deserializer 234. The lock condition signal 278 may then be sent to the PI 238, which may determine the sampling clock signal 284 based on the PI code signal 248 and the lock condition signal 278.

Figure 3:
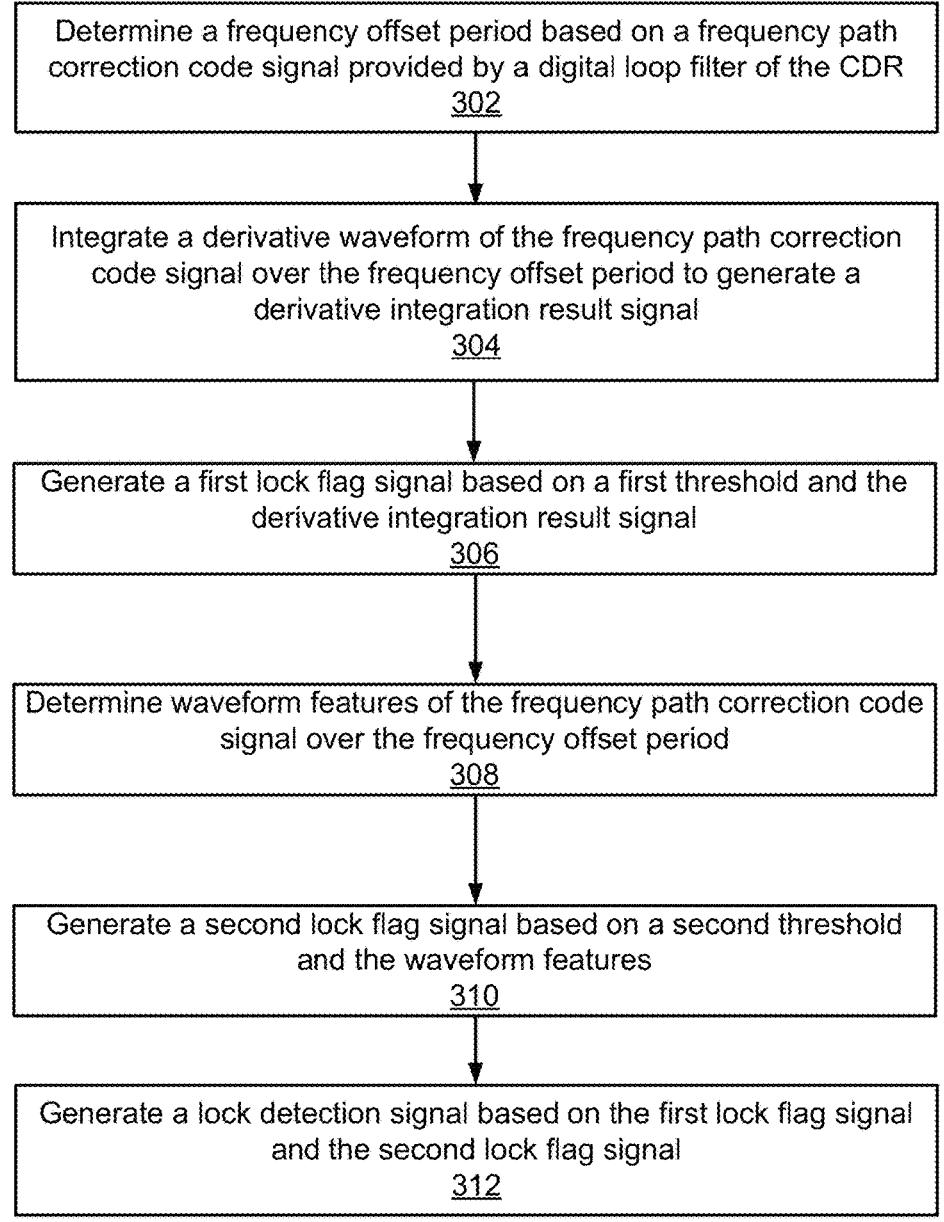
FIG. 3 is a flow diagram illustrating an example of a method for CDR lock detection according to some embodiments of the present disclosure.
Figure 4:
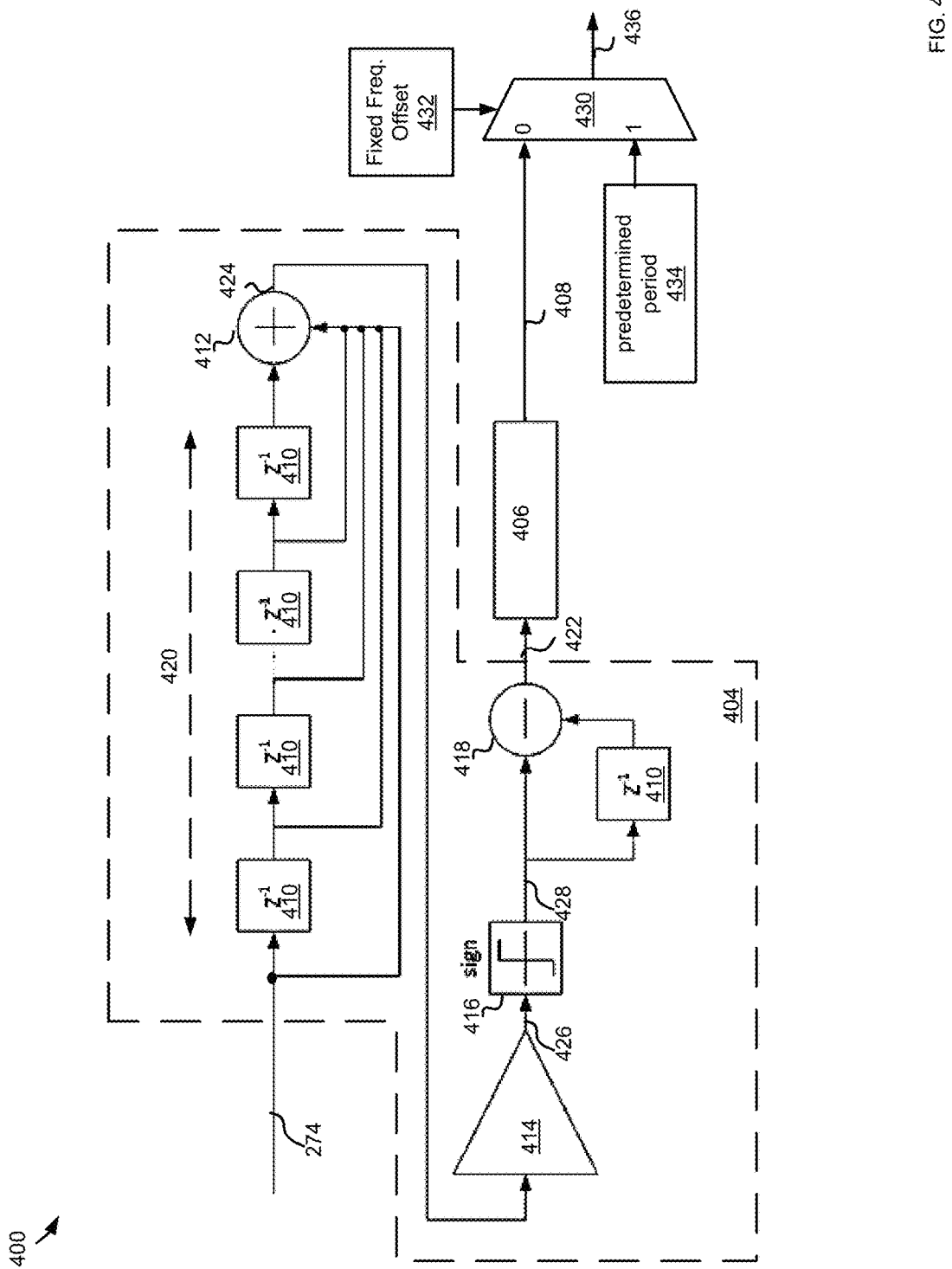
FIG. 4 is a block diagram illustrating an example of a period generator circuit according to some embodiments of the present disclosure.
Figure 5:
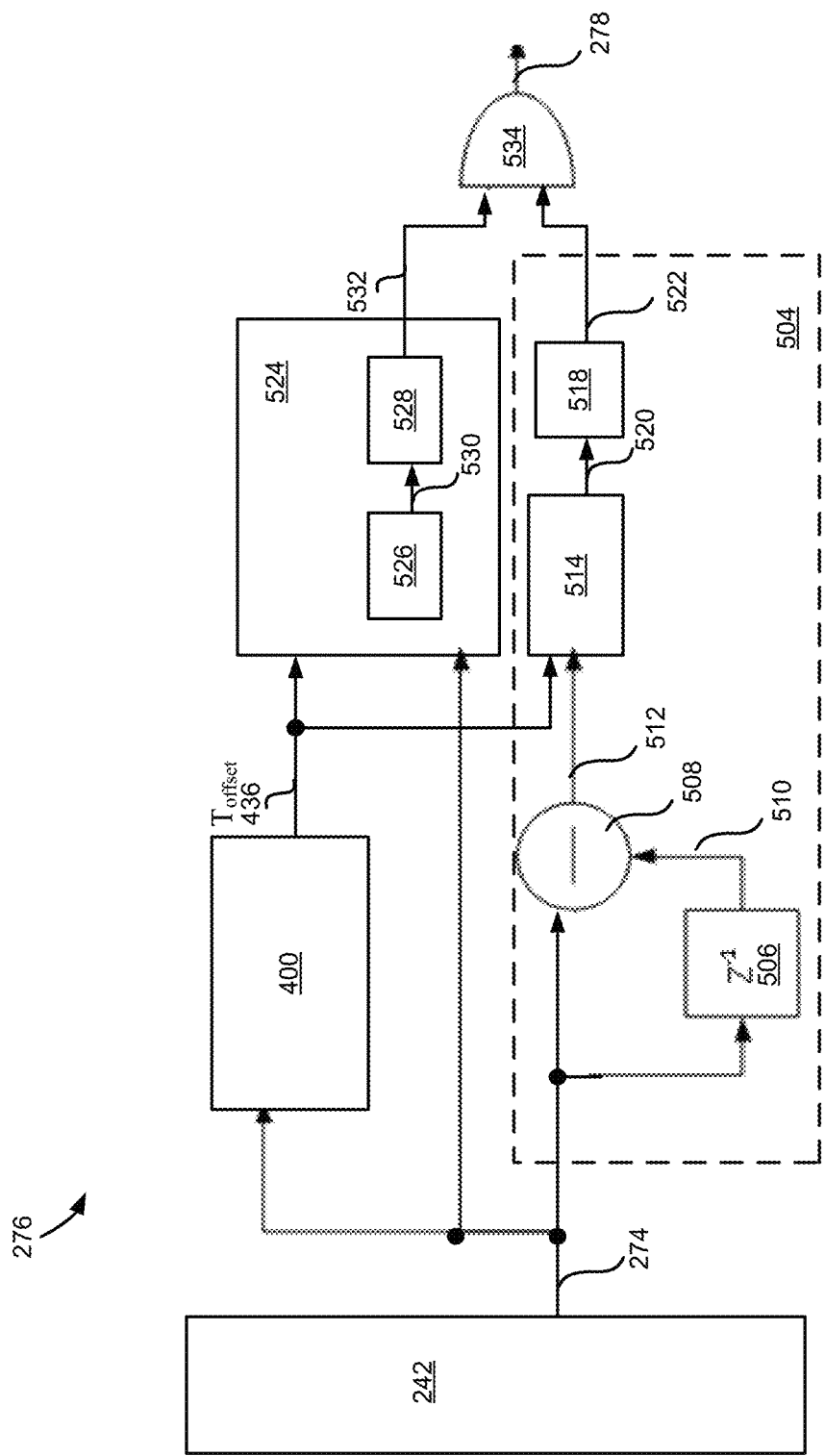
FIG. 5 is a block diagram illustrating an example of a lock detector circuit according to some embodiments of the present disclosure.

Referring to FIGS. 3, 4, 5, 6, 7, 8, 9, and 10, a system and method for lock detection are described. FIG. 3 illustrates a method for lock detection. FIGS. 4 and 5 illustrate examples of a lock detector circuit for a CDR. FIGS. 6, 7, 8, 9, and 10 illustrate waveforms of the lock detector circuits with various configurations including for example different frequency offset configurations.

Referring to FIG. 3, a method 300 for lock detection of the CDR is illustrated. The method 300 begins at block 302, where a frequency offset period is determined based on a frequency path correction signal from a CDR loop filter. Referring to FIG. 4, illustrated is an exemplary period generator circuit 400 that may be used to determine a period of the frequency offset (e.g., associated with a period of SSC or SJ). The period generator circuit 400 receives a frequency path correction signal 274 from the digital loop filter 250. The frequency path correction signal 274 is sent to a moving average circuit 404 to generate a moving average output signal 422. The moving average output signal 422 may then be sent to a period extraction circuit 406. The period extraction circuit 406 may determine a frequency offset period 408 using the moving average output signal 422.

The moving average circuit 404 includes a moving average filter that has N (e.g., 4096) taps. The N taps may also be referred to as a moving average window 420. The moving average window 420 may be configured by a user. A summing circuit 412 is used to generate a moving average signal 424. The moving average signal 424 may be divided (e.g., by a divider 414 having a divider factor up to the tap number N) based on the moving average window 420 to generate a divider output signal 426. The divider output signal 426 is sent to a sign circuit 416, which generates a signal 428 based on the signs of the values of the divider output signal 426. In an example, the signal 428 may include zero-crossing pulses. The signal 428 is sent to an input of a subtractor circuit 418. The signal 428 is also sent to an input of a delay element 410, and an output of the delay element 410 is coupled to the subtractor circuit 418. The subtractor 418 may generate a signal 422 by subtracting the output of the delay element 410 from the signal 428. In some embodiments, the subtractor circuit 418 generates a signal including the difference between the current input and the previous input. As such, it may generate pulses of the zero crossing points of a periodic signal, which may assist the period extraction circuit 406 to mark starting time point and extract the period.

In some embodiments, the signal 422 is sent to a period extraction circuit 406, which generates a frequency offset period 408. The period extraction circuit 406 may use various period extraction algorithms. In an example, the frequency offset period estimate 408 may be generated based on adjacent peaks of the signal 422. In another example, the frequency offset period estimate 408 may be generated based on adjacent pitches of the signal 422.

In some embodiments, the frequency offset between the receiver reference clock 222 and the transmitter reference clock 220 is fixed. In such embodiments, the period generator 400 may provide a predetermined period as the frequency offset period estimate. The period generator 400 may include a multiplexer 430 receiving a fixed frequency offset signal 432 at its select input. In an example, the fixed frequency offset signal 432 has a value of "1" indicating that the frequency offset between the receiver reference clock 222 and the transmitter reference clock 220 is fixed. In that example, the multiplexer 430 outputs a frequency offset period signal 436 (denoted by $T_{offset}$) including a predetermined period 434 (e.g., 1000 cycles of the receiver reference clock 222). The predetermined period 434 may be configurable and changed by a user. In another example, the fixed frequency offset signal 432 has a value of "0" indicating that the frequency offset between the receiver reference clock 222 and the transmitter reference clock 220 may change over time. In that example, the multiplexer 430 outputs a frequency offset period signal 436 including the frequency offset period estimate 408.

The method 300 may then proceed to block 304, where a derivative of the frequency path correction signal is integrated over $T_{offset}$ to generate a derivative integration result signal. Referring to FIG. 5, illustrated is a lock detector circuit 276. The lock detector circuit 276 includes a lock flag generator 504. The lock flag generator 504 may receive the frequency path correction signal 274 (e.g., from a digital loop filter 250), and send the frequency path correction signal 274 to a subtractor circuit 508. The frequency path correction signal 274 may also be sent to a delay element 506. An output 510 of the delay element 506 is coupled to another input of the subtractor circuit 508. The subtractor circuit 508 may generate a derivative frequency path correction signal 512 by subtracting the signal 510 from the frequency path correction signal 274.

In some embodiments, the derivative frequency path correction signal 512 is sent to an integrate and dump circuit 514, which performs an integrate and dump process to the derivative frequency path correction signal 512 over $T_{offset}$ to generate a derivative integration result signal 520. In an example, the integrate and dump process creates a cumulative sum of the discrete-time values of the derivative frequency path correction signal 512, and resets the sum to zero according to $T_{offset}$.

The method 300 may then proceed to block 306, where a first lock flag signal is generated based on the derivative integration result signal 520. Referring to the example of FIG. 5, the derivative integration result signal 520 is sent to a comparator 518, which outputs a first lock flag signal 522. In an example, the comparator 518 compares the derivative integration result signal 520 to a derivative integration result threshold. In some embodiments, an operator may configure the derivative integration result threshold. In some embodiments, the derivative integration result threshold may be determined based on a locked dithering range (e.g., between −5 and +5) when the CDR circuit is in a locked condition and an out-of-lock dithering range (e.g., between −10 and +10) when the CDR circuit is in an out-of-lock condition. In an example, derivative integration result threshold may have a value (e.g., 6, 7) that is between the largest value (e.g., 5) of the locked dithering range and the largest value (e.g., 10) of the out-of-lock dithering range. In some embodiments, the derivative integration result threshold may be configured based on channel conditions and various CDR settings. If the derivative integration result signal 520 is less than the derivative integration result threshold, the lock flag 522 is set to "high." If the integration result signal 520 is greater than the integration result threshold, the lock flag 522 is set to "low."

The method 300 may then proceed to block 308, where waveform features of the frequency path correction signal are extracted. Referring to the example of FIG. 5, the lock detector circuit 276 includes a lock flag generator 524 for generating a lock flag signal based on features (e.g., maximum values, minimum values, any other features associated with the waveform profile) of the waveform of the frequency path correction signal 274. The lock flag generator 524 includes a feature extraction circuit 526 and a comparator 528. The feature extraction circuit 526 receives the frequency path correction signal 274, and extracts features of the waveform of the frequency path correction signal 274 over $T_{offset}$.

The method 300 may then proceed to block 310, where a second lock flag signal is generated based on the extracted features provided at block 308. Referring to the example of FIG. 5, an extracted features signal 530 is from the feature extraction circuit 526 to the comparator 528, which generates a second lock flag signal 532. In an example, the comparator 528 compares the extracted features in the extracted features signal 530 to one or more extracted features thresholds. In some embodiments, the extracted feature thresholds may be configured based on various factors including for example, channel conditions, whether the frequency offset is static or periodic, CDR settings. In some embodiments, the second lock flag signal 532 is determined based on a single extracted value. For example, if an extracted feature is less than the extracted feature threshold, the second lock flag signal 532 may have a "high" value. For further example, if the extracted feature is greater than the extracted feature threshold, the second lock flag 522 has a "low" value. In some embodiments, the second lock flag signal 532 is determined based on a plurality of extracted features. The second lock flag signal 532 may have a "high" value when all of the plurality of extracted features are less than the corresponding extracted features thresholds, and have a "low" value otherwise.

The method 300 may then proceed to block 312, where a lock condition signal is generated based on the first lock flag signal and/or the second lock flag signal. Referring to the example of FIG. 5, a lock condition signal generator 534 receives the first lock flag signal 522 and the second lock flag signal 532, and generates a lock condition signal 278. In an example, the lock condition signal generator 534 includes an AND gate. In that example, when both the first lock flag signal 522 and the second lock flag signal 532 are high, the lock condition signal 278 is high. When either one of the first lock flag signal 522 and the second lock flag signal 532 is low, the lock condition signal 278 is low.

Figure 6:
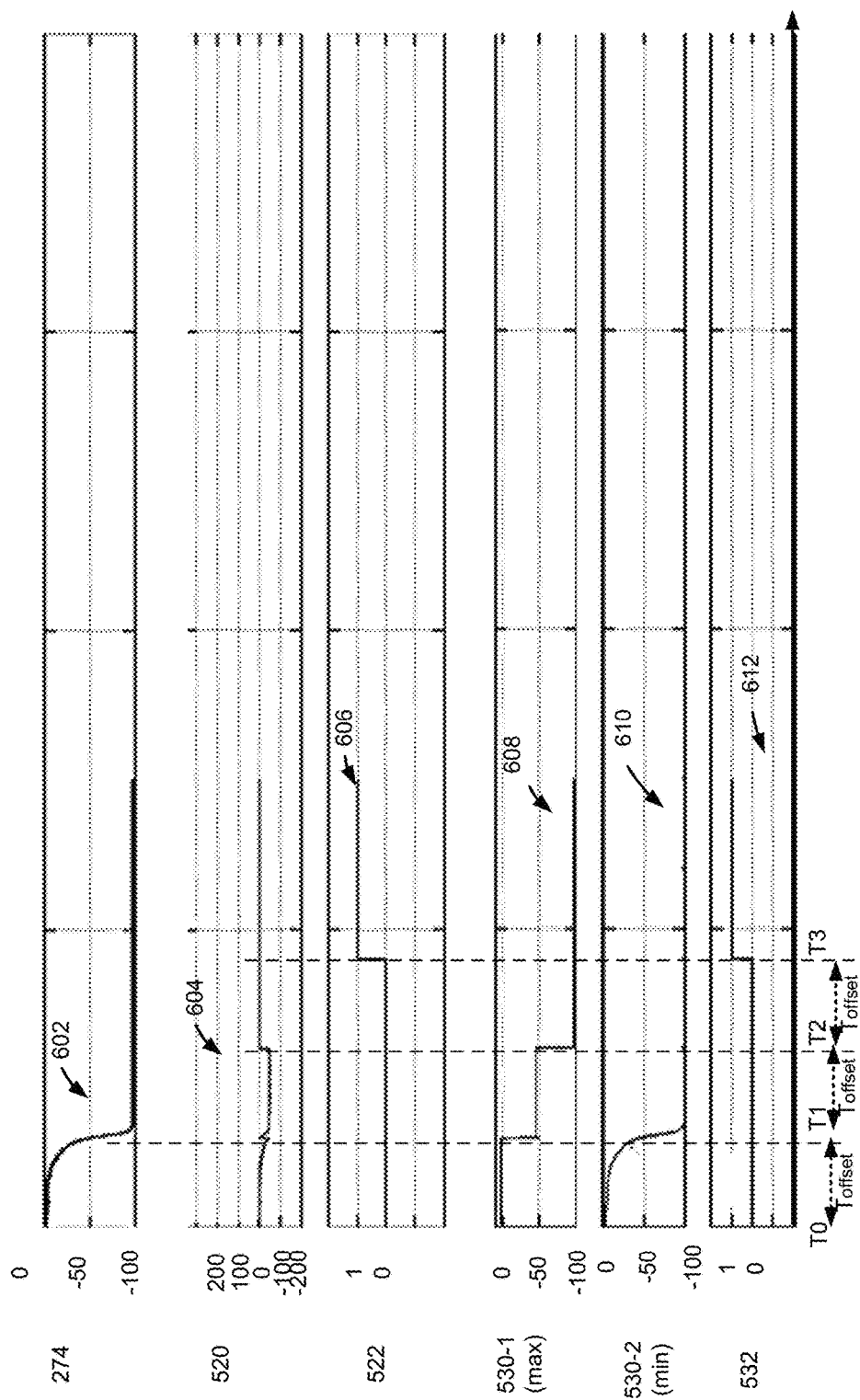
FIG. 6 illustrates waveforms of an exemplary lock detector circuit according to some embodiments of the present disclosure.
Figure 7:
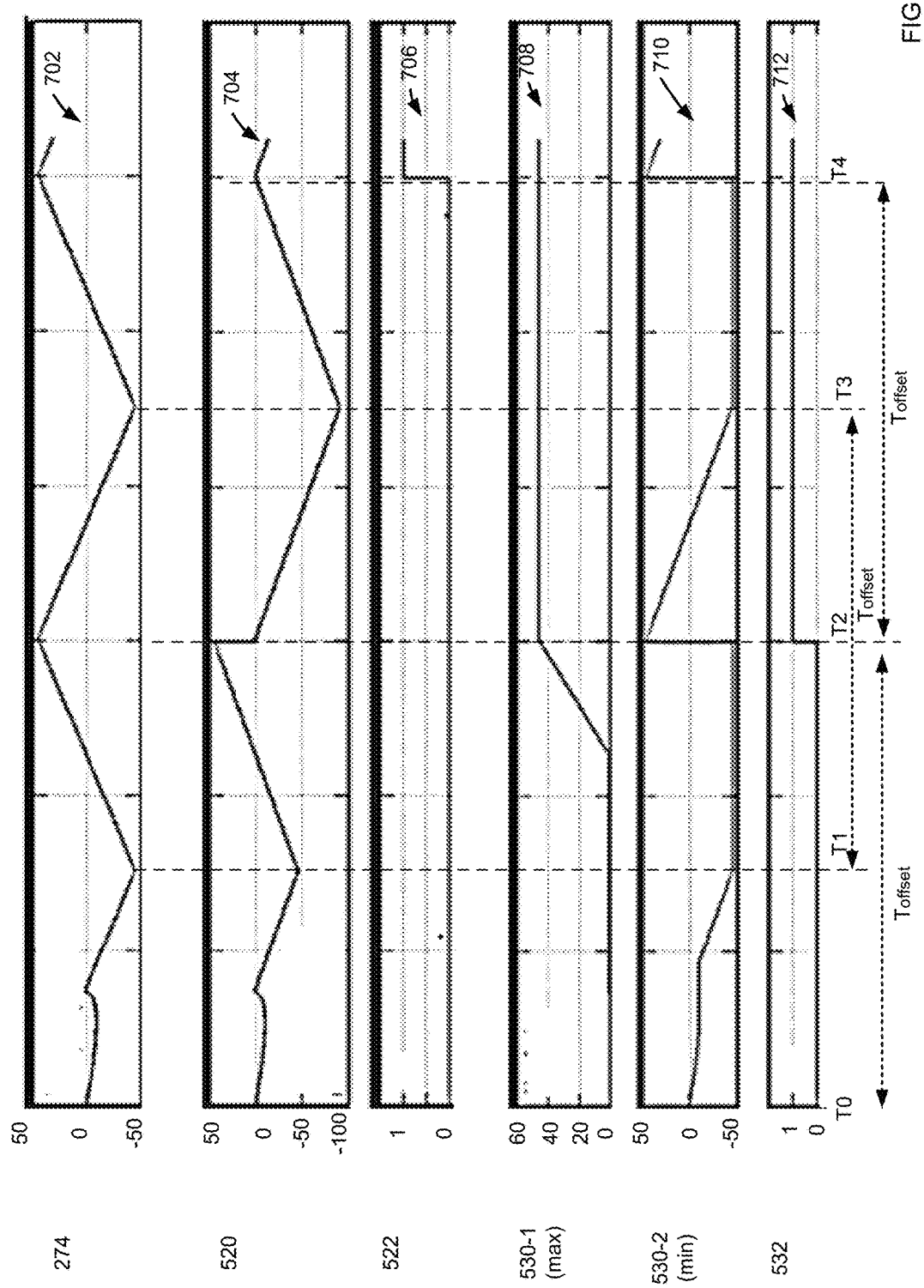
FIG. 7 illustrates waveforms of an exemplary lock detector circuit according to some embodiments of the present disclosure.
Figure 8:
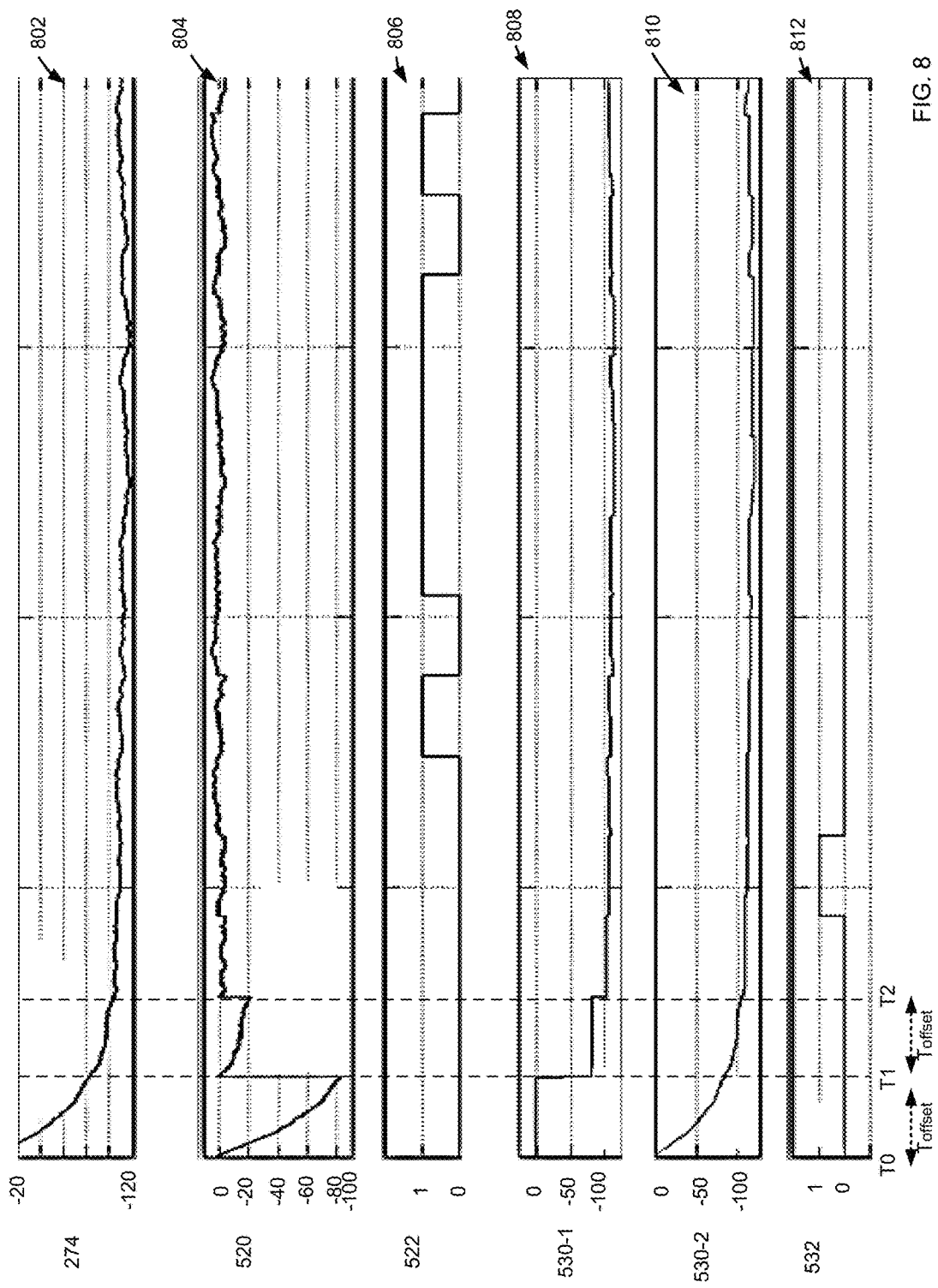
FIG. 8 illustrates waveforms of an exemplary lock detector circuit according to some embodiments of the present disclosure.
Figure 9:
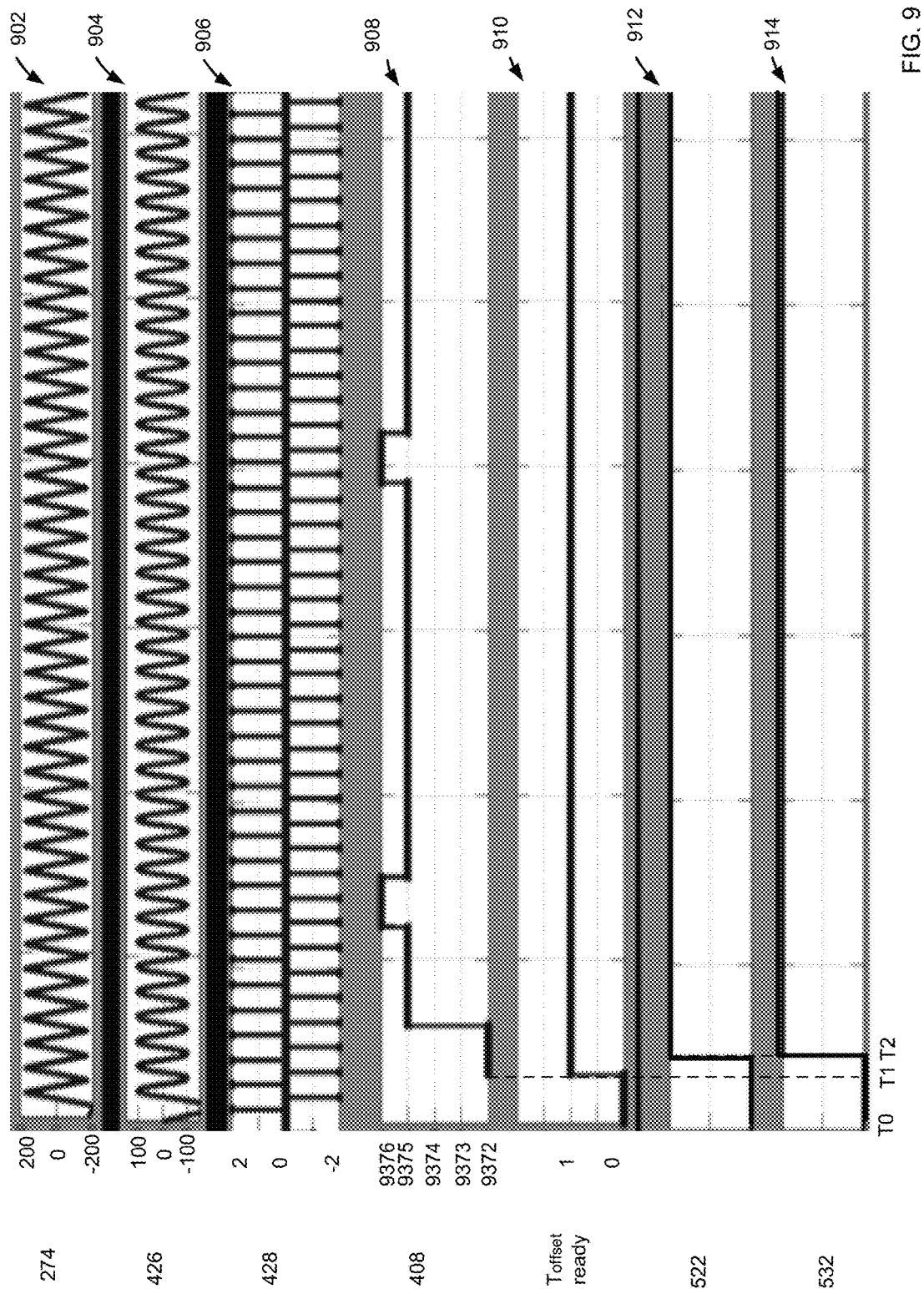
FIG. 9 illustrates waveforms of an exemplary lock detector circuit according to some embodiments of the present disclosure.
Figure 10:
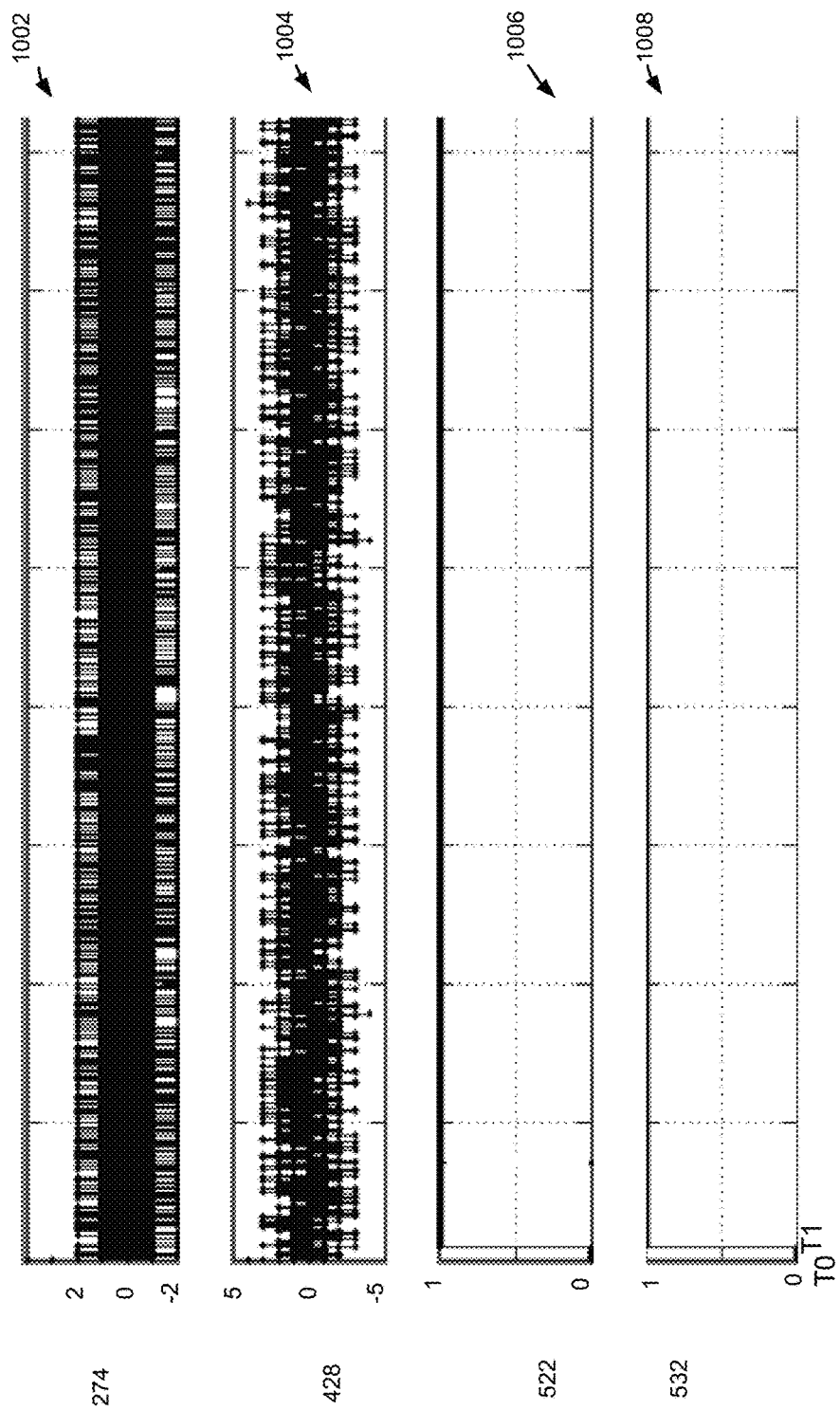
FIG. 10 illustrates waveforms of an exemplary lock detector circuit according to some embodiments of the present disclosure.

Referring to FIGS. 6, 7, 8, 9, and 10, the lock detector circuit 276 may operate in various configurations. FIG. 6 illustrates the waveforms of the lock detector circuit 276 where the communication system 200 has a fixed frequency offset of −3000 parts per million fractional differences (ppm) at 2.5 gigabytes (GB)/second between the transmitter 202 and the receiver 204. FIG. 7 illustrates the waveforms of the lock detector circuit 276 where the communication system 200 implements SSC with a frequency offset sweep between +5600 ppm to −5600 ppm at the period of 30 microseconds (µs) and data rate of 16 GB/s. FIG. 8 illustrates the waveforms of the lock detector circuit 276 where the communication system 200 has a fixed frequency offset (e.g., −6000 ppm at 2.5 GB/s) that is outside of the CDR 216's capacity. FIG. 9 illustrates the waveforms of the lock detector circuit 276 operating under a particular user-configurable moving average window (e.g., 4096). FIG. 10 illustrates the waveforms of the lock detector circuit 276 where the communication system 200 is a synchronous system with a frequency offset of 0 ppm.

Referring to FIG. 6, illustrates therein are the waveforms of the lock detector circuit 276 where an exemplary lock detector circuit 276 uses a fixed frequency offset of −3000 ppm at 2.5 gigabits (Gb)/second. In such an example, the frequency offset period $T_{offset}$ 436 is set to be a predetermined period, for example, 1000 CDR clock cycles. Curves 602, 604, 606, 608, 610, and 612 illustrate waveforms for signals 274, 520, 522, 530-1, 530-2, and 532 respectively. As shown by the curve 602, the frequency correction code 274 decreases from 0 to about −90 between times T0 and T1, and decreases to −100 right after T1 and then remains at −100. As shown by the curve 604, the corresponding derivative integration result signal 520 is reset to 0 at times T1 and T2 by the integrate and dump process according to the frequency offset period $T_{offset}$, and remains at 0 after T2. As shown by the curve 606, at a particular time, the comparator 518 determines that at time T3, the derivative integration result signal 520 over the preceding frequency offset period $T_{offset}$ is less than a first threshold (e.g., 5), and sets the first lock flag signal 522 to high.

As illustrated by curves 608, 610, and 612, a second lock flag signal 532 may be generated based on extracted features 530-1 (maximum value) and 530-2 (minimum value) of the frequency path correction signal 274 over the frequency offset period $T_{offset}$. For example, as shown by curve 608, the extracted maximum value 530-1 over $T_{offset}$ remains at 0 between times T0 and T1, remains at −50 between times T1 and T2, and remains at −100 after time T3. For further example, as shown by curve 610, the extracted minimum value 530-2 is substantially similar to the curve 602 of the frequency path correction signal 274. As shown by the curve 612, the comparator 528 determines that at time T3, the maximum value 530-1, the minimum value 530-2, or the combination thereof, over the frequency offset period $T_{offset}$ is less than a second threshold, and sets the second lock flag signal 532 to high.

In the example of FIG. 6, a lock condition signal 278 may be generated based on the first lock flag signal 522, the second lock flag signal 532, or a combination of the first lock flag signal 522 and the second lock flag signal 532. In an example, the lock condition signal 278 is the same as the first lock flag signal 522 that is generated based on a derivative of the frequency correction code 274. In another example, the lock condition signal 278 is the same as the second lock flag signal 532 that is generated based on features of the frequency correction code 274. Yet in another example, the lock condition signal 278 is generated by performing an AND operation to the first lock flag signal 522 and the second lock flag signal 532.

Referring to FIG. 7, illustrated are waveforms of the lock detector circuit 276 of a receiver 204 receiving an input signal that is frequency-modulated with SSC to spread the spectral energy peaks out over a wider bandwidth. In the example of FIG. 7, the SSC is implemented with a frequency offset swept between +5600 ppm to −5600 ppm within a period of 30 µs and a data rate of 16 Gb/s. Curves 702, 704, 706, 708, 710, and 712 illustrate waveforms for signals 274, 520, 522, 530-1, 530-2, and 532 respectively. As shown by the curve 702, the frequency correction code 274 increases from −50 to 50 between times T1 and T2, decreases from 50 to −50 between times T2 and T3, and then increases from −50 to 50 between times T3 and T4. In the example of FIG. 7, the fixed frequency offset signal 432 provided to the period generator 400 is set to 0, indicating that the frequency offset may change over time. Accordingly, the period generator 400 provides the frequency offset period signal 436 that is determined by the period extraction circuit 406 based on the frequency correction code 274. Specifically, in an example, $T_{offset}$ is determined based on a distance between T1 and T3, which correspond to two adjacent pitches of the frequency correction code 274. In another example, $T_{offset}$ is determined based on a distance between T2 and T4, which correspond to two adjacent peaks of the frequency correction code 274.

As shown by the curve 702, the frequency correction code 274 has a triangular modulation profile, indicating that the SSC has a similar triangular modulation profile. In various embodiments, the SSC may have a profile of various shapes including, for example, a saw-tooth shape, a sinusoidal shape, and any other shapes. As shown by the curve 704, the derivative integration result signal 520 includes triangular shapes that are similar to those of the profile of the frequency correction code 274. In the curve 704, the derivative integration result signal 520 is set to 0 at times T2 and T4 according to $T_{offset}$. As shown by the curve 706, the comparator 518 determines that at time T4, the derivative integration result signal 520 over the preceding frequency offset period $T_{offset}$ (e.g., between times T2 and T4) is less than a particular threshold, and sets the first lock flag signal 522 to logic "high."

As illustrated by curves 708, 710, and 712, a second lock flag signal 532 may be generated based on extracted features 530-1 (maximum value) and/or 530-2 (minimum value) of the frequency path correction signal 274 over the frequency offset period $T_{offset}$. For example, as shown by curve 708, the extracted maximum value 530-1 over the preceding frequency offset period $T_{offset}$ increases from 0 to 50 between times T1 and T2, and remains at 50 after time T2. For further example, as shown by curve 710, the extracted minimum value 530-2 over the preceding frequency offset period $T_{offset}$ remains at 0 between times T1 and T2, increases to 50 at time T2, decreases to 0 between times T2 and T3, and remains at 0 between times T3 and T4. As shown by the curve 712, the comparator 528 determines that at time T2, the maximum value 530-1, the minimum value 530-2, or the combination thereof, over the frequency offset period $T_{offset}$ is less than a second threshold, and sets the second lock flag signal 532 to high.

In the example of FIG. 7, a lock condition signal 278 may be generated by performing an AND operation to the first lock flag signal 522 and the second lock flag signal 532, where the lock condition signal 278 is set to logic "high" starting from time T4. In another example, the lock condition signal 278 may be generated based on the lock condition signal 278 without using the second lock flag signal 532.

Referring to FIG. 8, illustrated are waveforms of the lock detector circuit 276 for a receiver 204, where the receiver 204 has a fixed frequency offset of −6000 ppm at 2.5 Gb/s with regard to the transmitter 202. In the particular example, the frequency offset is out of the capacity of the CDR 216. As illustrated in FIG. 8, in that example, the lock condition signal 278 generated based on the first lock flag signal 522 and/or the second lock flag signal 532 indicates that the CDR 216 remains in an unlocked state. In the example of FIG. 8, curves 802, 804, 806, 808, 810, and 812 illustrate waveforms for signals 274, 520, 522, 530-1, 530-2, and 532 respectively. Because the frequency offset is fixed, the period generator 400 may generate a frequency offset period signal 436 including a predetermined period (e.g., 1000 CDR cycles). As shown by the curve 806, neither of the first lock flag signal 522 and the second lock flag signal 532 consistently stay at a "high" state. As such, the lock detector 276 may perform an AND operation (e.g., by using the AND circuit 534) to the first lock flag signal 522 and the second lock flag signal 532, and generate the lock condition signal 278. The lock condition signal 278 remains at "low," indicating that the CDR 216 is not in a locked state.

Referring to FIG. 9, illustrated are waveforms of the lock detector circuit 276 for a receiver 204, where a moving average window 420 of the period generator circuit 400 is set to be 4096. As shown in FIG. 9, the period generator circuit 400 correctly extracts the frequency offset period based on the frequency correction code 274, which is consistent with the SSC profile. In the example of FIG. 9, curves 902, 904, 906, 908, 910, 912, and 914 illustrate waveforms for signals 274, 426, 428, 436, a $T_{offset}$ ready signal, 522, and 532 respectively. The $T_{offset}$ ready signal may be provided by the period generator 400 based on the signal 436, and may indicate that $T_{offset}$ is ready to be used by the lock flag generators 504 and 524. As shown by the curve 902, the frequency path correction signal 274 has a triangular profile that is consistent with the SSC profile. Curve 904 illustrates the moving average output signal 422 of the period generator 400, where the moving average window 420 of the period generator 400 is configured to be 4096. Curve 906 illustrates the zero crossing pulses signal 428 including pulses corresponding to zero crossings of the moving average output signal 422. As shown by curve 908, a stable $T_{offset}$ (e.g., in a range between 9372 and 9376 μs) may be generated. As shown by curve 910, a corresponding $T_{offset}$ ready signal has a logic "high" at time T1 after detecting a stable $T_{offset}$. In response to the $T_{offset}$ ready signal, the lock flag generators 504 and 524 may generate a first lock flag signal 522 and a second lock flag signal 532 based on the $T_{offset}$ respectively. As shown in curves 912 and 914, both the first lock flag signal 522 and second lock flag signal 532 are pulled to logic "high" at time T2. A lock condition signal 278 may be generated based on the first lock flag signal 522 and/or second lock flag signal 532, which may indicate that the CDR is in a locked status from time T2.

Referring to FIG. 10, illustrated are waveforms of a lock detector circuit 276 for a receiver 204 in a synchronous communication system 200, where the frequency offset is zero. In such a system, the signal 436 provided by the period generator 400 may include a predetermined period (e.g., 1000 CDR cycles). Curves 1002, 1004, 1006, and 1008 may correspond to signals 274, 428, 522, and 532 respectively. As shown in FIG. 10, the lock detector circuit 276 may detect the lock status of the CDR in such a synchronous communication system 200. For example, as shown by curves 1006 and 1008, both the first lock flag signal 522 and the second lock flag signal 532 consistently stay at "high." As such, the lock detector 276 may generate a lock condition signal 278 based on the first lock flag signal 522 and/or the second lock flag signal 532, which may indicate that the CDR 216 is in a locked state after T2.

It is noted that various configurations (e.g., the number and types of lock flag generators, the extracted features of the frequency correction code 274, the thresholds for the derivative integration result and the extracted features, the size of the moving average window, the predetermined period for a fixed frequency offset) illustrated in FIGS. 2A through 10 are exemplary only and not intended to be limiting beyond what is specifically recited in the claims that follow. It will be understood by those skilled in that art in possession of this disclosure that other configurations may be used.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:
1. A clock and data recovery (CDR) circuit, comprising:
a phase detector configured to generate a phase detect result signal in response to phase detection of a plurality of samples, the plurality of samples being generated by sampling a received signal based on a sampling clock signal provided by a phase interpolator;
a digital loop filter including:

a phase path configured to provide a phase path correction signal including a first estimate associated with a phase of the received signal based on the phase detect result signal;

a frequency path configured to provide a frequency path correction signal including a second estimate associated with a frequency of the received signal based on the phase detect result signal; and a phase interpolator code generator configured to generate a phase interpolator code for controlling the phase interpolator based on the phase path correction signal and frequency path correction signal; and a lock detector circuit configured to:
determine, using a period generator circuit, a frequency offset period based on the frequency path correction signal,
wherein the frequency offset period includes an estimate of a period of a frequency offset source in the received signal;
generate a lock condition signal based on the frequency offset period, the lock condition signal indicating a lock condition of the sampling clock signal associated with the received signal.

2. The CDR circuit of claim 1, wherein the lock detector circuit further comprises:
a first lock flag generator circuit configured to generate a first lock flag signal based on the frequency offset period and the frequency path correction signal,
wherein the lock condition signal is generated based on the first lock flag signal.

3. The CDR circuit of claim 2, wherein the first lock flag generator circuit includes:
a derivative generator circuit configured to generate a first derivative signal of the frequency path correction signal;
an integrate and dump circuit configured to perform an integrate and dump process to the first derivative signal based on the frequency offset period to generate a derivative integration result signal; and
a first comparator circuit configured to generate the first lock flag signal by comparing the derivative integration result signal with a first threshold.

4. The CDR circuit of claim 3, wherein the lock detector circuit further comprises:
a second lock flag generator circuit configured to generate a second lock flag signal based on the frequency offset period and the frequency path correction signal,
wherein the lock condition signal is generated based on the first and second lock flag signals.

5. The CDR circuit of claim 4, wherein the second lock flag generator circuit includes:
a feature extraction circuit configured to determine a first feature of the frequency path correction signal based on the frequency offset period; and
a second comparator circuit configured to generate the second lock flag signal by comparing the first feature with a second threshold.

6. The CDR circuit of claim 1, wherein the lock detector circuit further comprises:
a first lock flag generator circuit including:
a feature extraction circuit configured to determine a first feature of the frequency path correction signal based on the frequency offset period; and
a comparator circuit configured to generate a first lock flag signal by comparing the first feature with a first threshold;

wherein the lock condition signal is generated based on the first lock flag signal.

7. The CDR circuit of claim 6, wherein the first feature is one of a minimum value of the frequency path correction signal over the frequency offset period and a maximum value of the frequency path correction signal over the frequency offset period.

8. The CDR circuit of claim 1, wherein the period generator circuit further comprises:
a moving average circuit configured to generate a moving average signal by applying a moving average filter to the frequency path correction signal; and
a peak detection circuit configured to determine the frequency offset period based on adjacent peaks of the moving average signal.

9. The CDR circuit of claim 1, wherein the period generator circuit is configured to:
receive a fixed frequency offset indicator indicating that the frequency offset is a constant; and
provide the frequency offset period based on a predetermined period for the fixed frequency offset.

10. The CDR circuit of claim 1, wherein the frequency offset source is spread spectrum clocking (SSC) or sinusoidal litter (SJ) associated with the received signal.

11. A method, comprising:
generating a plurality of samples by sampling a received signal using a sampling clock provided by a phase interpolator;
generating a phase detect result signal in response to phase detection of the plurality of samples;
generating, by a phase path of a digital loop filter, a phase path correction signal including a first estimate associated with a phase of the received signal based on the phase detect result signal;
generating, by a frequency path of the digital loop filter, a frequency path correction signal including a second estimate associated with a frequency of the received signal based on the phase detect result signal;
generating a phase interpolator code for controlling the phase interpolator based on the phase path correction signal and frequency path correction signal;
determining a frequency offset period based on the frequency path correction signal,
wherein the frequency offset period includes an estimate of a period of a frequency offset source in the received signal; and
generating a lock condition signal based on the frequency offset period, the lock condition signal indicating a lock condition of the sampling clock associated with the received signal.

12. The method of claim 11, further comprising:
generating a first lock flag signal based on a derivative integration result signal generated by integrating a derivative of the frequency path correction signal over the frequency offset period; and
generating the lock condition signal based on the first lock flag signal.

13. The method of claim 12, wherein the generating the first clock flag signal further comprises:
generating the first lock flag signal by comparing the derivative integration result signal with a first threshold.

14. The method of claim 13, further comprising:
generating a second lock flag signal based on the frequency offset period and the frequency path correction signal; and generating the lock condition signal based on the first and second lock flag signals.

15. The method of claim 14, further comprising:
determining a first feature of the frequency path correction signal based on the frequency offset period; and
generating the second lock flag signal by comparing the first feature with a second threshold.

16. The method of claim 12, further comprising:
determining a first feature of the frequency path correction signal based on the frequency offset period; and
generating the first lock flag signal by comparing the first feature with a first threshold.

17. The method of claim 16, wherein the first feature is one of a minimum value of the frequency path correction signal over the frequency offset period and a maximum value of the frequency path correction signal over the frequency offset period.

18. The method of claim 11, further comprising:
generating a moving average signal by applying a moving average filter to the frequency path correction signal; and
determining the frequency offset period based on adjacent peaks of the moving average signal.

19. The method of claim 11, further comprising:
receiving a fixed frequency offset indicator indicating that the frequency offset is a constant; and
providing the frequency offset period based on a predetermined period for the fixed frequency offset.

20. The method of claim 11, wherein the frequency offset source is spread spectrum clocking (SSC) or sinusoidal litter (SJ) associated with the received signal.

* * * * *